US010705364B2

(12) United States Patent
Isono et al.

(10) Patent No.: US 10,705,364 B2
(45) Date of Patent: Jul. 7, 2020

(54) IMAGE DISPLAY APPARATUS

(71) Applicant: Panasonic Intellectual Property Management Co., Ltd., Osaka (JP)

(72) Inventors: Takamitsu Isono, Osaka (JP); Yumie Itou, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 16/095,289

(22) PCT Filed: Feb. 6, 2018

(86) PCT No.: PCT/JP2018/004000
§ 371 (c)(1),
(2) Date: Oct. 19, 2018

(87) PCT Pub. No.: WO2018/147269
PCT Pub. Date: Aug. 16, 2018

(65) Prior Publication Data
US 2019/0129230 A1 May 2, 2019

Related U.S. Application Data

(60) Provisional application No. 62/456,842, filed on Feb. 9, 2017.

(30) Foreign Application Priority Data

Aug. 24, 2017 (JP) ................................. 2017-161452

(51) Int. Cl.
G02F 1/1333 (2006.01)
G02F 1/13357 (2006.01)
(Continued)

(52) U.S. Cl.
CPC .. *G02F 1/133308* (2013.01); *G02F 1/133603* (2013.01); *G02F 1/133606* (2013.01);
(Continued)

(58) Field of Classification Search
CPC ......... G02F 1/133308; G02F 1/133603; G02F 1/133606; G02F 1/133608;
(Continued)

(56) References Cited

U.S. PATENT DOCUMENTS

2006/0139955 A1 6/2006 Noh et al.
2012/0176558 A1* 7/2012 Nakamura ........ G02F 1/133605
348/790

(Continued)

FOREIGN PATENT DOCUMENTS

JP 2006-179494 A 7/2006
JP 2010-128049 A 6/2010
(Continued)

OTHER PUBLICATIONS

International Search Report and Written Opinion issued in International Application No. PCT/JP2018/004000 dated Apr. 3, 2018 (with English translation of Search Report).
(Continued)

Primary Examiner — Kevin Quarterman
(74) Attorney, Agent, or Firm — McDermott Will & Emery LLP

(57) ABSTRACT

An image display apparatus includes: a display panel; a rear frame which is plate-shaped and located on a back side of the display panel; a plurality of LED sheets which are attached to the rear frame, and on which components, which are light sources for illuminating the display panel from the back side of the display panel, are mounted; and a relay sheet which is flexible and provided with wiring for relaying power to be supplied to the plurality of LED sheets.

4 Claims, 11 Drawing Sheets

(51) Int. Cl.
*H04N 5/64* (2006.01)
*H05K 1/18* (2006.01)

(52) U.S. Cl.
CPC ......... *G02F 1/133608* (2013.01); *H04N 5/64* (2013.01); *G02F 2001/133314* (2013.01); *G02F 2001/133612* (2013.01); *H05K 1/189* (2013.01); *H05K 2201/10106* (2013.01)

(58) Field of Classification Search
CPC ........ G02F 2001/133314; G02F 2001/133612; H05K 1/189; H05K 2201/10106; H04N 5/64
See application file for complete search history.

(56) References Cited

U.S. PATENT DOCUMENTS

| 2014/0204309 A1* | 7/2014 | Sakurai | G02F 1/133603 |
| | | | 349/61 |
| 2018/0045877 A1* | 2/2018 | Shimizu | G02B 6/0055 |
| 2018/0135841 A1* | 5/2018 | Yonezawa | F21S 4/20 |

FOREIGN PATENT DOCUMENTS

| JP | 2015-232497 A | 12/2015 |
| WO | 2016/148087 A1 | 9/2016 |

OTHER PUBLICATIONS

Extended European Search Report issued in European Patent Application No. 18751789.1, dated Apr. 17, 2020.

* cited by examiner

IMAGE DISPLAY APPARATUS

CROSS REFERENCE

This application is the U.S. National Phase under 35 U.S.C. § 371 of International Application No. PCT/JP2018/004000 filed on Feb. 6, 2018, which claims the benefit of U.S. Provisional Application No. 62/456,842 filed Feb. 9, 2017 and Japanese Application No. 2017-161452 filed on Aug. 24, 2017, the entire contents of each are hereby incorporated by reference.

TECHNICAL FIELD

The present disclosure relates to an image display apparatus which includes a display panel such as a liquid crystal cell and a component mounting board such as a light-emitting diode (LED) sheet which includes light sources for illuminating the display panel from the back side of the display panel.

BACKGROUND ART

Patent Literature (PTL) 1 discloses an image display apparatus which includes a liquid crystal panel, a base plate located on the back side of the liquid crystal panel, and an LED sheet attached to the base plate.

CITATION LIST

Patent Literature

PTL 1: Japanese Unexamined Patent Application Publication No. 2006-179494

SUMMARY OF THE INVENTION

Technical Problem

The present disclosure provides an image display apparatus which allows variation in the attachment position of a component mounting board such as an LED sheet on which light sources are mounted.

Solution to Problem

An image display apparatus according to the present disclosure is an image display apparatus including: a display panel for displaying an image; a foundation member which is plate-shaped and located on a back side of the display panel, at a position opposite to the display panel; a plurality of component mounting boards which are attached to the foundation member on a side closer to the display panel, and on which components are mounted, the components being light sources for illuminating the display panel from the back side of the display panel; and a relay sheet which is flexible and provided with wiring for relaying power to be supplied to the plurality of component mounting boards.

Advantageous Effect of Invention

According to an image display apparatus according to the present disclosure, even if variation in the position of a component mounting board attached to a foundation member occurs, a relay sheet can absorb the variation and supply power.

DESCRIPTION OF EXEMPLARY EMBODIMENT

Figure 12:
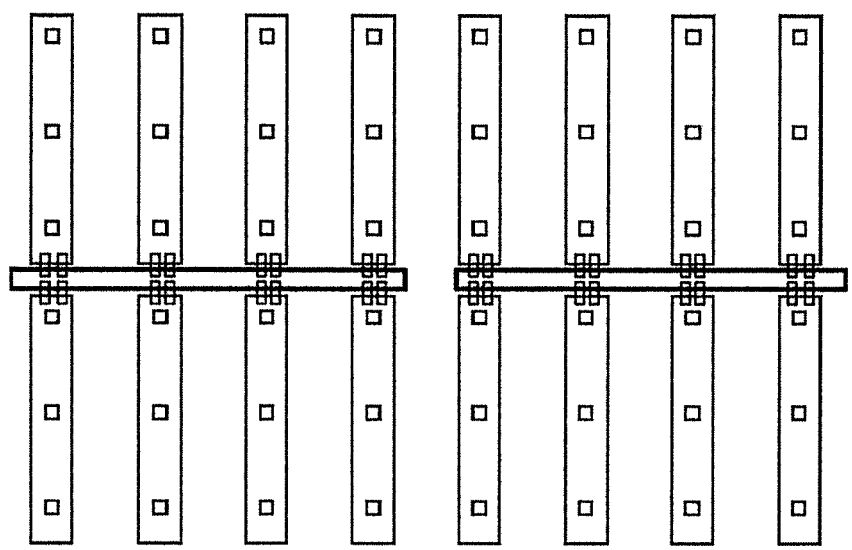
FIG. 12 is a schematic diagram illustrating a relation between conventional component mounting boards and relay substrates.
Figure 13:
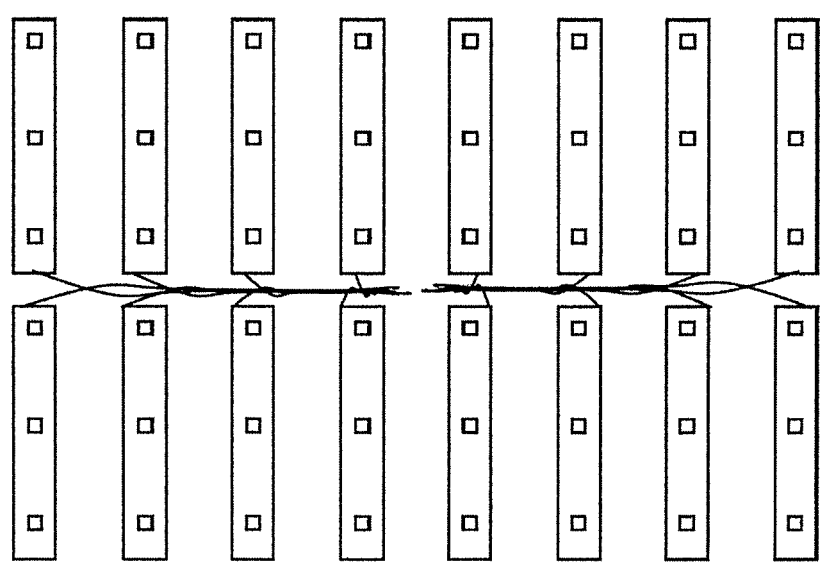
FIG. 13 is a schematic diagram illustrating a relation between conventional component mounting boards and harnesses.

The inventors of the present application have found the following problems regarding the connection between LED sheets used in conventional image display apparatuses. Even in a conventional image display apparatus such as a liquid crystal television, a highly rigid foundation member, also referred to as a rear frame, is located on the back side of a liquid crystal panel, and an LED sheet on which light sources for backlights are mounted is attached to the foundation member. Conventionally, as illustrated in FIG. 12, when rigid component mounting boards are connected using rigid relay substrates, assembly is difficult and positional variation of the component mounting boards after assembly cannot be absorbed. Consequently, problems occur such as shifts in the position of LEDs which are light sources and concentration of stress at the connecting portion between the component mounting board and the relay substrate. In addition, as illustrated in FIG. 13, when rigid component mounting boards are connected using harnesses, the number of components increases, and the height of a connector, which is a connecting portion between the component mounting board and the harness, increases, and thus reduction of thickness of the image display apparatus is hindered. In addition, in any of the cases, the thickness of the component mounting board increases, and the connector, for instance, pushes up on a reflection sheet, thereby causing luminance irregularity.

In response to the aforementioned problems, the inventors of the present application have found that variation in assembly can be absorbed by utilizing a flexible circuit board, or what is called a flexible printed circuit (FPC), as a relay substrate for relaying power to the LED sheet. Furthermore, the inventors have found that providing a slit in the relay substrate increases the flexibility of the relay substrate and improves the workability of wiring connection between the LED sheet and the relay substrate using a metal pin connector. In addition, by providing a recess in the foundation member at a location corresponding to a connecting portion of the LED sheet and the relay substrate, and by connecting the LED sheet and the relay substrate using a low-height metal connector, bulging of the reflection sheet due to the reflection sheet being pushed up by the connector is prevented, and the reflection sheet is kept flat. Furthermore, setting the relay substrate to be longer than the minimum dimension required for relaying by 0.3 mm to 1.0 mm enables improvement with regard to the likelihood of positional variations.

By configuring an image display apparatus as described above, it was confirmed that the following advantageous effects could be produced. Specifically, by reducing the stress concentration at a connecting portion of the LED sheet and the relay substrate, reliability and quality of the image display apparatus can be improved. By providing a slit in the relay substrate, flexibility of the relay substrate increases, and thus improvement with regard to the likelihood of variation in the attachment position of the LED sheet is made. By preventing the reflection sheet from bulging and keeping the reflection sheet flat, luminance irregularity can be prevented and display quality can be improved.

In addition, the width of a double-sided tape, which is one of the adhesive layers for sticking the LED sheet to the foundation member called a rear frame, is made wider than that of the LED sheet, so that the double-sided tape is disposed to extend beyond the LED sheet. In this manner, the LED sheet and the reflection sheet are stuck together at the same time using the double-sided tape. Furthermore, by providing a hole in the LED sheet and exposing the double-sided tape, the reflection sheet is also stuck near the LED. Consequently, since the reflection sheet can be stuck near the LED, optical performance can be improved, variation of light can be reduced, and cost can be reduced as a result of reduction in the number of components.

An image display apparatus according to an aspect of the present disclosure which is based on the above-mentioned knowledge includes: a display panel for displaying an image; a foundation member called a rear frame which is plate-shaped and located on a back side of the display panel, at a position opposite to the display panel; a plurality of component mounting boards, such as LED sheets, which are attached to the foundation member on a side closer to the display panel, and on which components, which are light sources for illuminating the display panel from the back side of the display panel, are mounted; and a relay substrate which is flexible and provided with wiring for relaying power to be supplied to the plurality of component mounting boards.

In addition, the relay substrate may include a first slit which increases flexibility of the relay substrate and a second slit that crosses the first slit.

In addition, the relay substrate may include a metal pin connected with a component mounting board among the plurality of component mounting boards and protruding from an edge of the relay substrate adjacent to the first slit, in a direction crossing the first slit.

In addition, the foundation member may include, at a location corresponding to a connecting portion of a component mounting board among the plurality of component mounting boards and the relay substrate, a recessed portion that is recessed in a direction away from the display panel.

In addition, the image display apparatus may include an adhesive layer which has a length that extends beyond a component mounting board among the plurality of component mounting boards, at least at positions on the component mounting board at which the components are mounted, and sticks a reflection sheet and the plurality of component mounting boards to the foundation member.

EMBODIMENT

Hereinafter, embodiments will be described with reference to the drawings as appropriate. However, unnecessarily detailed descriptions may be omitted. For example, detailed descriptions of items already widely known and redundant descriptions regarding substantially the same configurations may be omitted. This is to avoid unnecessary redundancy in the following descriptions, and facilitate understanding by a person skilled in the art.

Note that the accompanying drawings and the following description are provided by the inventors in order for a person skilled in the art to sufficiently understand the present disclosure, and are thus not intended to limit the subject matter recited in the claims.

In addition, in the following embodiments, for the convenience of describing the following embodiments, the up-down direction represents the Y-axis direction, the forward-backward direction represents the Z-axis direction, and the left-right direction represents the X-axis direction. This is not intended to limit the orientation of image display apparatus 10 according to the present disclosure during manufacture or at the time of usage. In addition, in the following description, the positive side of the X-axis indicates the direction in which an arrow of the X-axis is pointing, and the negative side of the X-axis indicates the direction opposite to the positive side of the X-axis. The same applies to the Y-axis and the Z-axis.

Figure 1:
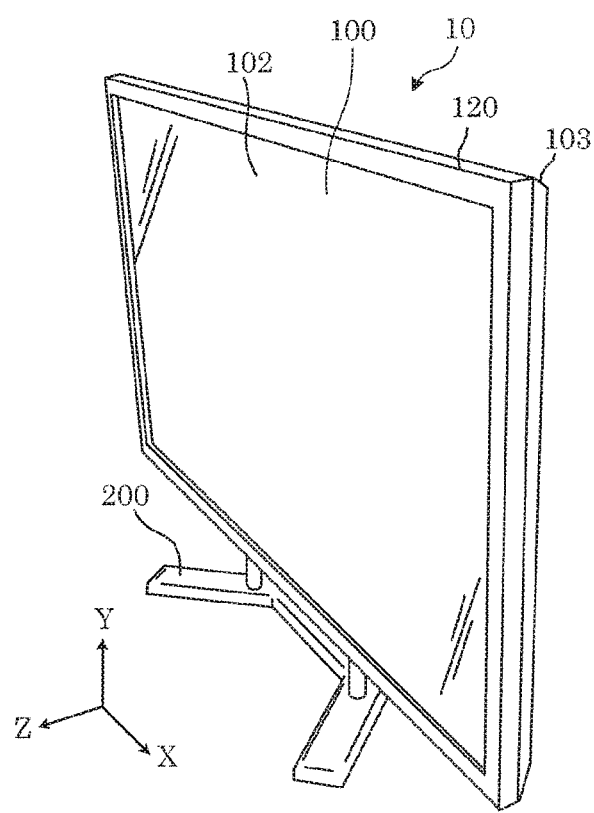
FIG. 1 is a perspective view of an external appearance of an image display apparatus according to an embodiment.

FIG. 1 is a perspective view of an external appearance of an image display apparatus according to an embodiment.

As illustrated in the figure, image display apparatus 10 according to the present embodiment is a liquid crystal television, and includes display panel 102, bezel 120, back cover 103, and stand 200.

In the present embodiment, display panel 102 is a so-called liquid crystal cell, and is an element in which liquid crystals are enclosed between glass plates. Display panel 102 is controlled based on a video signal input to image display apparatus 10, and displays an image according to the video signal.

Bezel 120 and back cover 103 are structural members that form the outer shell of image display apparatus 10 which house display panel 102 and others. Bezel 120 protects the periphery of elements, such as display panel 102, and also forms a bezel (frame). In the present embodiment, resin, such as polycarbonate (PC) or the like, is used as the material for bezel 120 and back cover 103.

Figure 2:
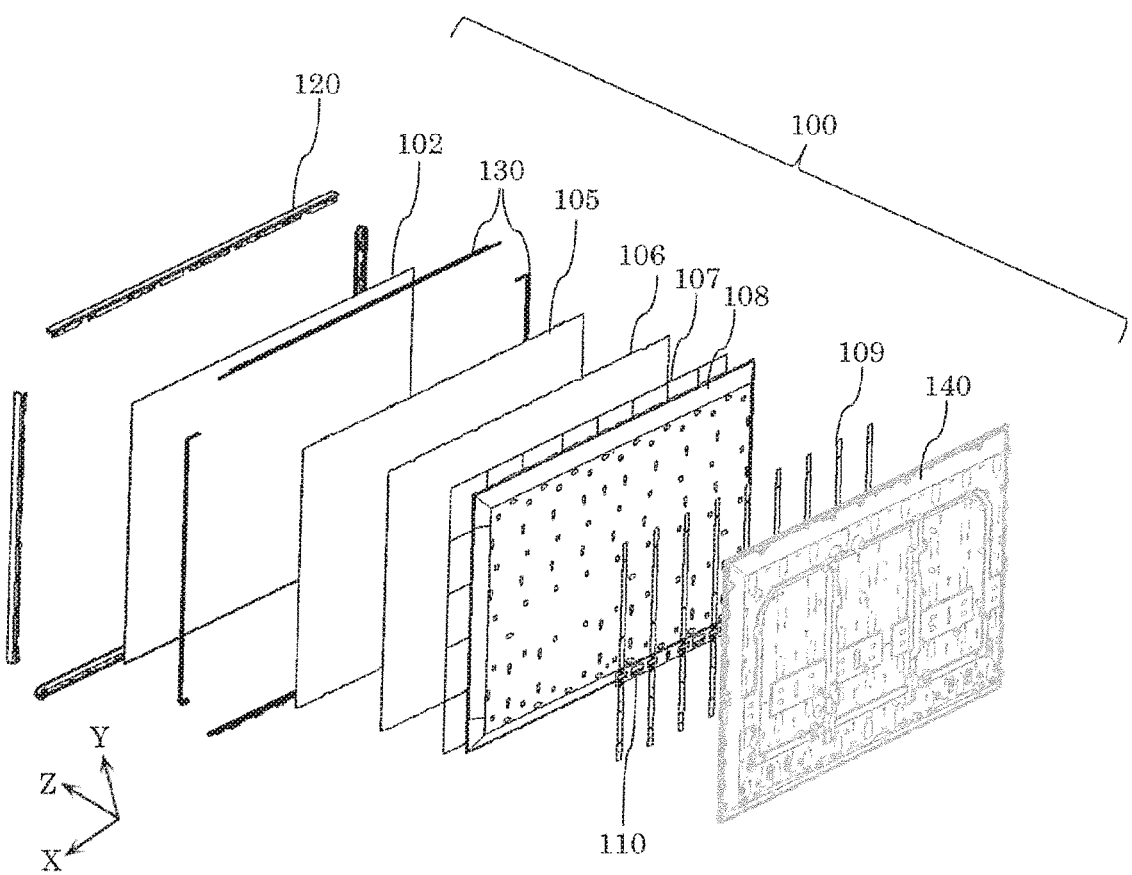
FIG. 2 is an exploded rear perspective view of a liquid crystal module according to the embodiment.

FIG. 2 is an exploded rear perspective view of a liquid crystal module according to the embodiment.

Figure 3:
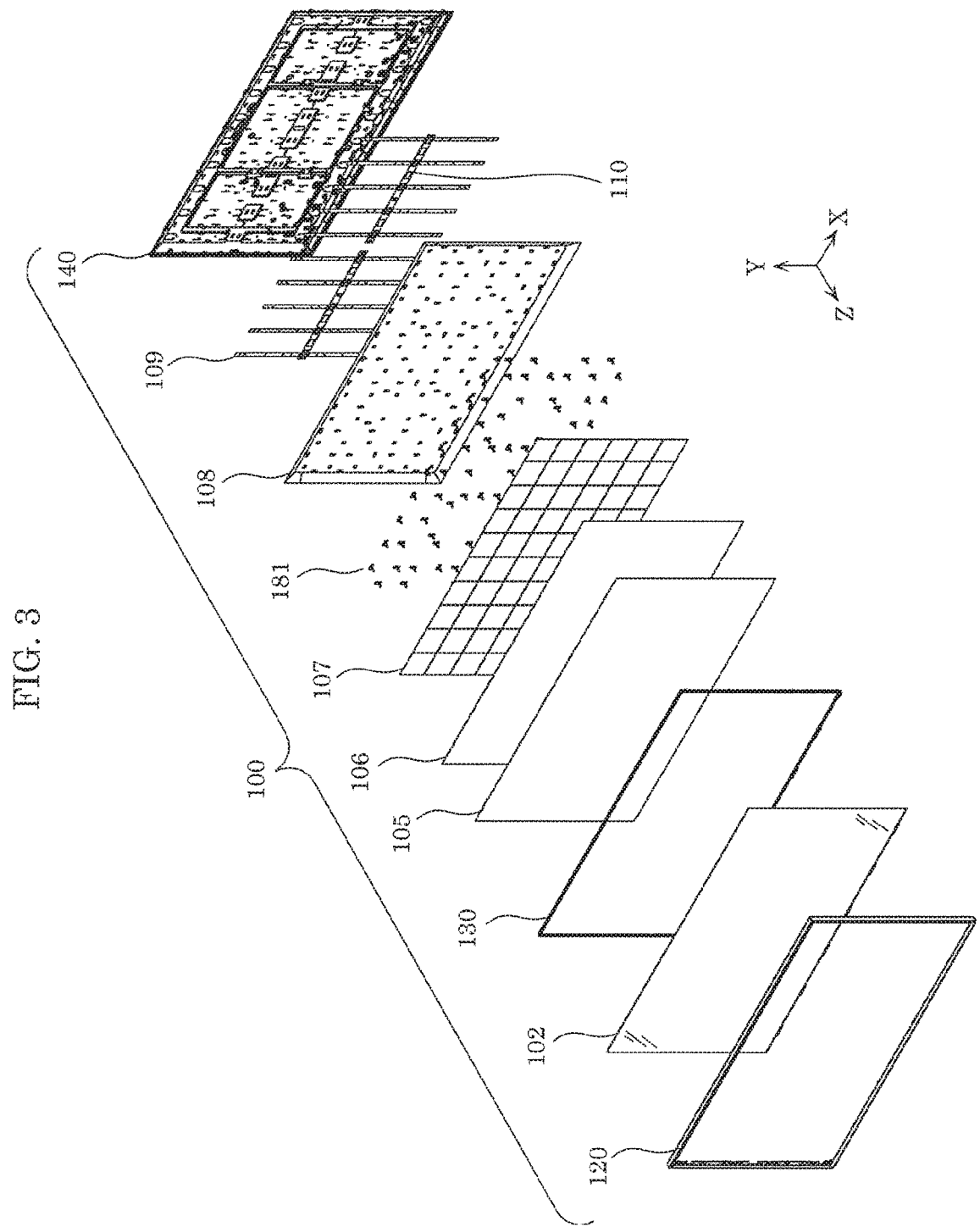
FIG. 3 is an exploded front perspective view of the liquid crystal module according to the embodiment.

FIG. 3 is an exploded front perspective view of the liquid crystal module according to the embodiment.

Bezel 120 houses components, from display panel 102 to rear frame 140. In the case of the present embodiment, mold frame 130, optical sheet unit 105 which includes two to three optical sheets, diffusion plate 106, luminance evening plate 107, reflection sheet 108, LED sheet 109 such as an LED sheet, relay sheet 110, rear frame 140 which is referred to as, for an instance, a rear frame, and support pins 181 are disposed in the space enclosed by bezel 120, back cover 103, and display panel 102.

Mold frame 130 supports display panel 102, and together with rear frame 140, sandwiches components (so-called backlights), from optical sheet unit 105 to LED sheet 109 and relay sheet 110.

Optical sheet unit 105 is configured by stacking two to three types of sheets having different optical properties. Optical sheet unit 105 includes, for instance, a vertical direction prism sheet, a horizontal direction prism sheet, a diffusion sheet, and the like.

Diffusion plate 106 diffuses the light from components which are light sources disposed on LED sheet 109 which will be described later.

Luminance evening plate 107 evens out the light from the components disposed on LED sheet 109. Luminance evening plate 107 is a member on which holes having different diameters are formed. Specifically, in luminance evening plate 107, holes having extremely small diameters are formed directly above the components which are light sources, and, at positions not directly above the components, holes are formed with larger diameters as the distance from the components increases. With the configuration described above, luminance evening plate 107 evens out the distribution characteristics of the light from each of the components which are light sources.

Diffusion plate 106 is a member which further diffuses the light from each of the components, the distribution characteristics of which have been uniformed by luminance evening plate 107. The light transmitted through diffusion plate 106 comes out as light having reduced luminance irregularity.

In reflection sheet 108, holes are provided at portions corresponding to the components which are light sources disposed on LED sheet 109.

Rear frame 140, which is referred to as, for a instance, a rear frame, is formed from a sheet metal, is a member to which LED sheet 109 and relay sheet 110 are stuck, and is a member referred to as, for instance, a rear frame. Specifically, after LED sheet 109 and relay sheet 110 are attached to rear frame 140, reflection sheet 108 is stuck to rear frame 140 such that the components which are light sources are exposed through each of the holes of reflection sheet 108. The light from each of the components is reflected by reflection sheet 108 and travels toward the positive side of the Z-axis.

Each of support pins 181 is attached from the top of reflection sheet 108 so as to sandwich reflection sheet 108, together with rear frame 140. Support pin 181 has a lead portion to be inserted into the hole provided in luminance evening plate 107 and a flange portion which supports luminance evening plate 107.

Luminance evening plate 107 includes the holes into which the lead portions of support pins 181 are inserted. Luminance evening plate 107 is attached to rear frame 140 using support pins 181, the lead portions of which are inserted into each of the holes and flange portions of which support luminance evening plate 107.

Diffusion plate 106 is supported by the tips (tips of the lead portions) of support pins 181, and at the same time, the peripheral portion of diffusion plate 106 is supported by rear frame 140.

In one side of rear frame 140 which is to be the upper part when image display device 10 is installed, a lanced tab is formed for hanging optical sheet unit 105. Optical sheet unit 105 is provided with a tab having a rectangular hole for hooking onto the lanced tab.

Figure 4:
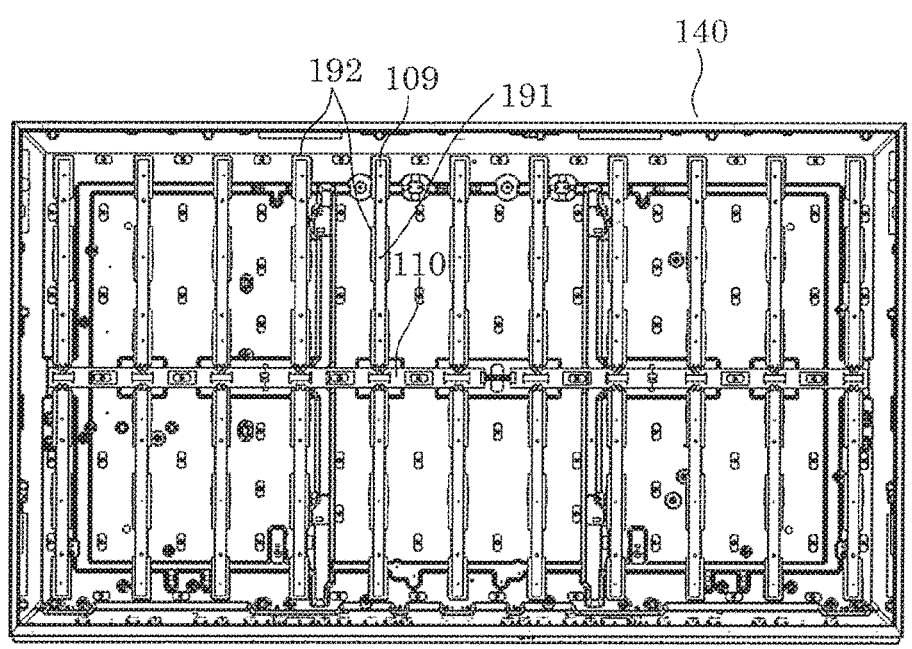
FIG. 4 is a plan view of a rear frame to which LED sheets and relay sheets according to the embodiment are stuck.

FIG. 4 is a plan view of a rear frame to which LED sheets and relay sheets according to the embodiment are stuck.

Figure 5:
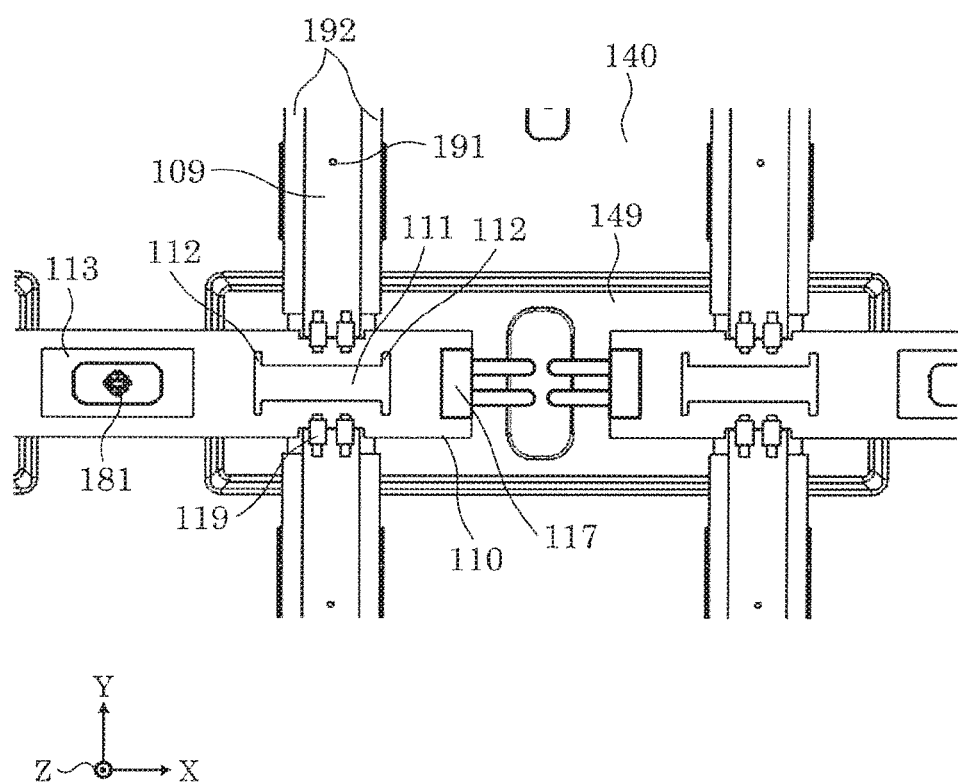
FIG. 5 is a plan view of a center portion of the rear frame according to the embodiment.
Figure 6:
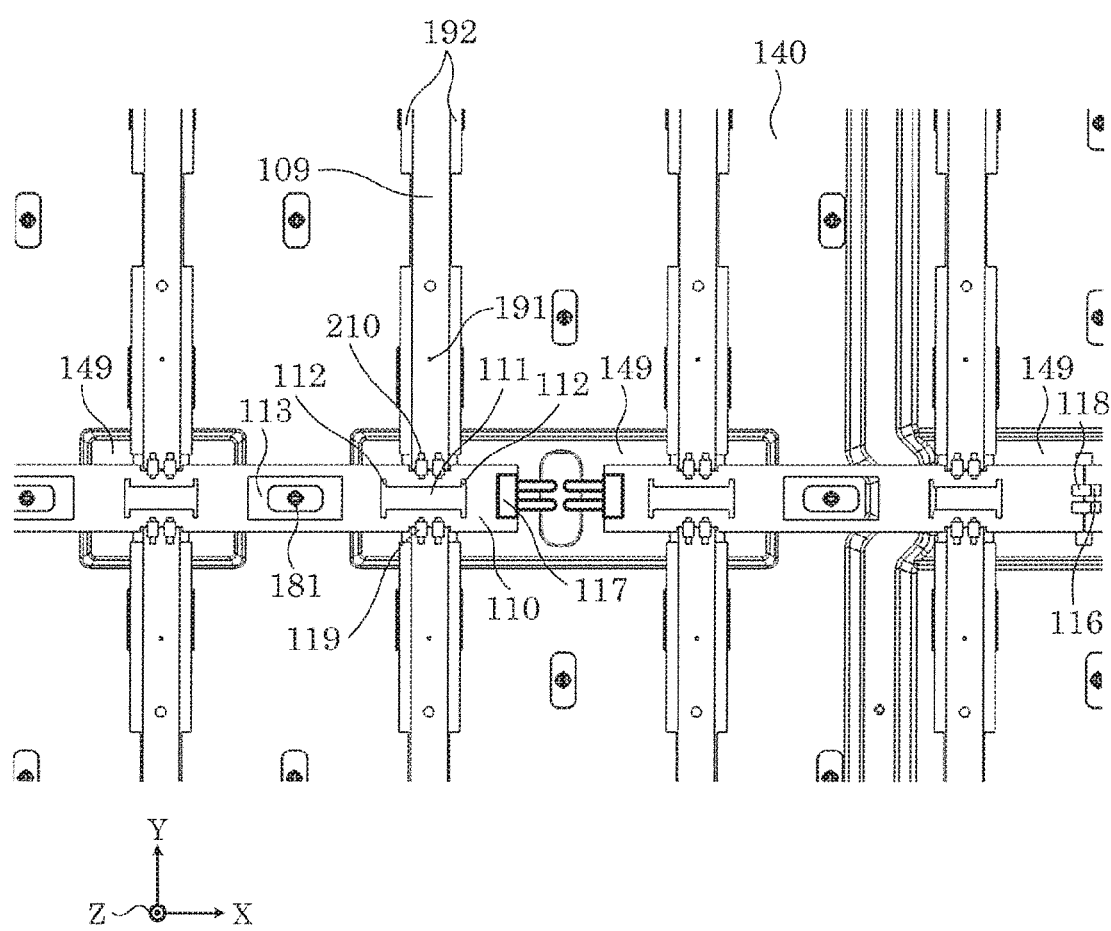
FIG. 6 is a plan view of the center portion of the rear frame according to the embodiment, illustrating a wider area than FIG. 5.
Figure 7:
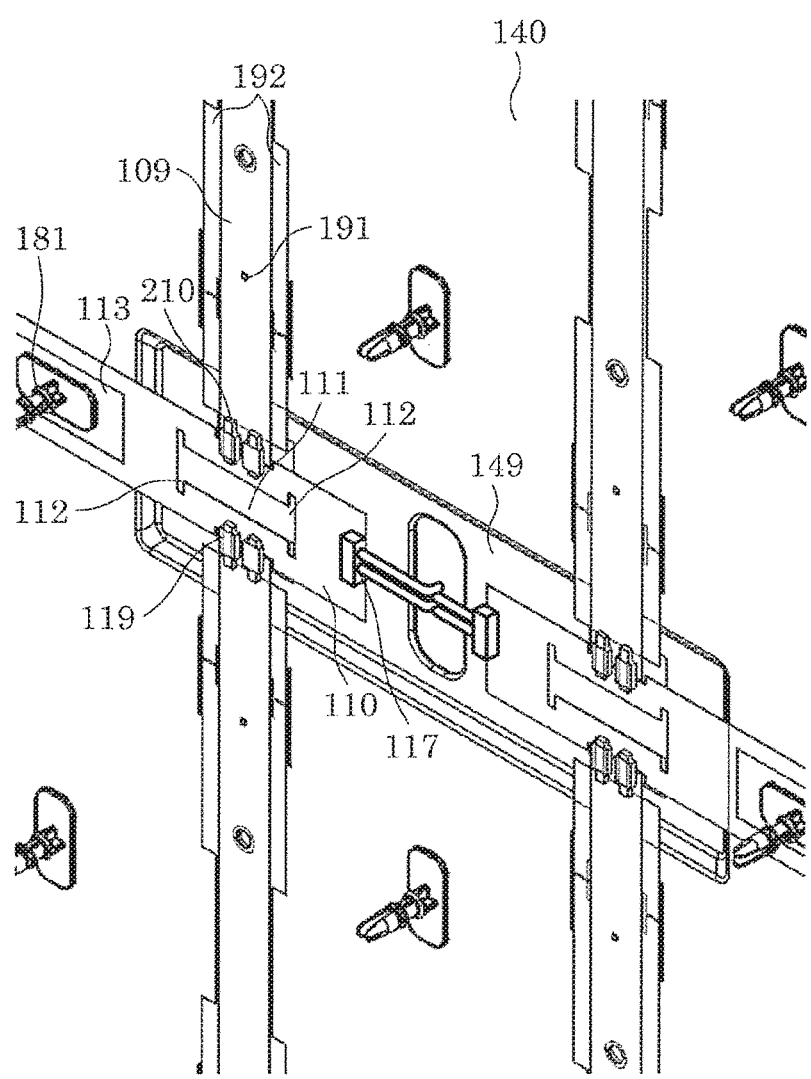
FIG. 7 is a perspective view of a center portion of the rear frame according to the embodiment.
Figure 8:
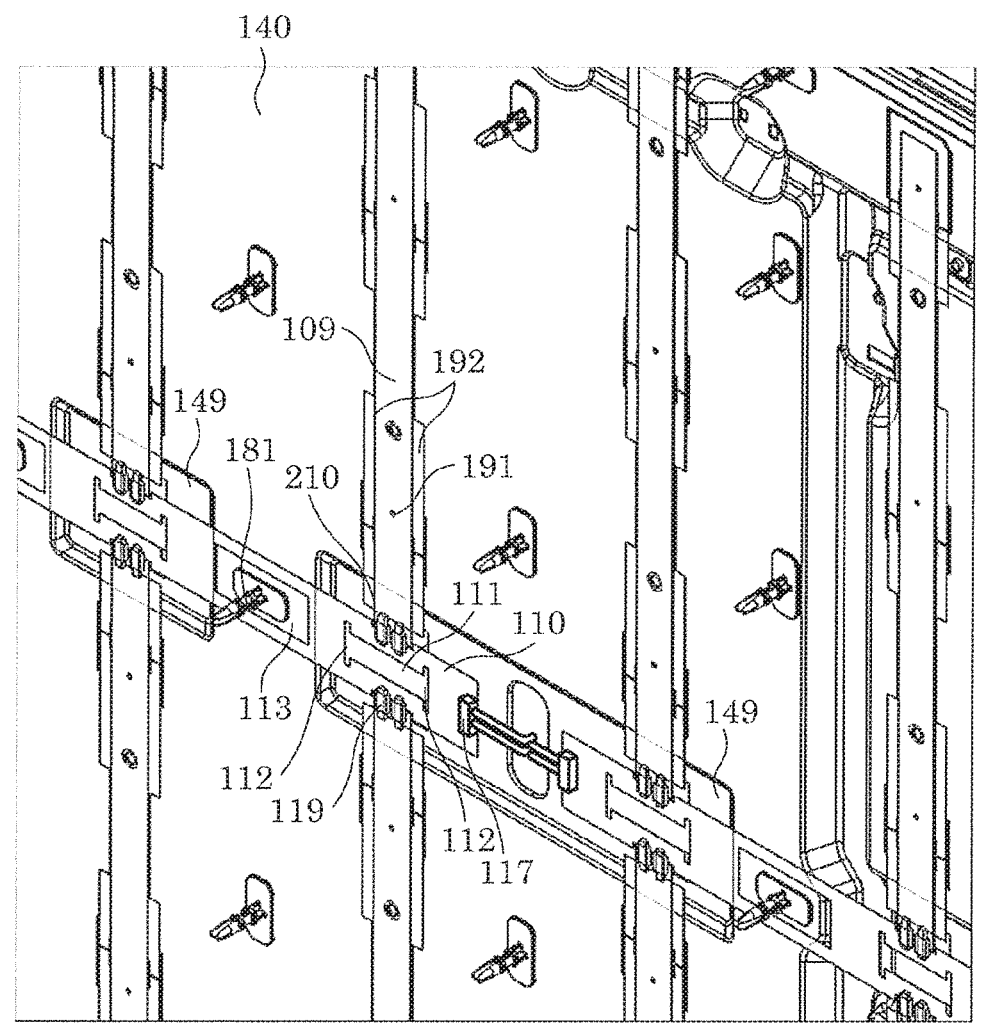
FIG. 8 is a perspective view of the center portion of the rear frame according to the embodiment, illustrating a wider area than FIG. 7.

FIG. 5 is a plan view of a center portion of the rear frame according to the embodiment. FIG. 6 is a plan view of the center portion of the rear frame according to the embodiment, illustrating a wider area than FIG. 5. FIG. 7 is a perspective view of a center portion of the rear frame according to the embodiment. FIG. 8 is a perspective view of the center portion of the rear frame according to the embodiment, illustrating a wider area than FIG. 7.

LED sheet 109 is a member attached to rear frame 140 on a side closer to display panel 102, and on which LEDs 191 which are light sources for illuminating display panel 102 from the back side of display panel 102 are surface mounted. LED sheet 109 is long-plate shaped and flexible, and is referred to as an LED sheet. LED sheet 109 includes a base film and a conductor layer whose pattern is formed over the entire surface of the base film. In the case of the present embodiment, LED sheet 109 includes first metal pin 210 made of metal for electrically connecting to relay sheet 110, and first metal pin 210 is connected to the conductor layer.

In the case of the present embodiment, LED sheet 109 is attached to rear frame 140 using adhesive layer 192 such as a restickable double-sided tape. Thus, for instance, during the manufacture of liquid crystal module 100, in the case where LED sheet 109 stuck to rear frame 140 is out of position, LED sheet 109 can be removed from rear frame 140 temporarily and stuck again to rear frame 140.

The base film is a resin film which is long, plate-shaped, and flexible, and has insulation properties. The base film is a member used as a foundation on which the conductor layer of a so-called flexible printed circuit (FPC) board is printed.

The conductor layer is a conductive layer attached in the form of a film to the principal surface of the base film. The material of the conductor layer is not particularly limited as long as the material is conductive, but in the case of the present embodiment, a straight-line patterned (rectangular) copper foil is used as the conductor layer.

In the case of the present embodiment, adhesive layer 192 has a length which extends beyond both sides of LED sheet 109 in the transverse direction (X-axis direction in the drawings), at least at positions on LED sheet 109 at which LEDs 191 are mounted, so as to stick reflection sheet 108 and LED sheet 109 to rear frame 140. Note that adhesive layer 192 at the longitudinal end of LED sheet 109 extends beyond LED sheet 109, not only in the transverse direction, but also in the longitudinal direction (Y-axis direction in the drawings).

LED 191 is not particularly limited as long as it is a component which can be mounted on LED sheet 109. In the case of the present embodiment, LED sheet 109 functions as a backlight for liquid crystal module 100, so LED 191 is an LED light source which emits white light.

Relay sheet 110 is a flexible component provided with wiring for relaying power to be supplied to LED sheets 109 between LED sheets 109 and a power supply board (not illustrated in the drawings). In the case of the present embodiment, like LED sheet 109, relay sheet 110 includes a base film and a conductor layer whose line pattern is formed over the entire surface of the base film for supplying power to LED sheet 109. Relay sheet 110 is in the shape of a rectangular belt, and includes, at the long-side portions of relay sheet 110, pairs of second metal pins 119 for connecting with first metal pins 210 of LED sheets 109. Relay sheet 110 is in a shape of a rectangular belt, and includes, at the long-side portions of relay sheet 110, pairs of second metal pins 119 for connecting with first metal pins 210 of LED sheets 109. The portions of relay sheet 110 to which the pairs of second metal pins 119 are attached are cut out in the shape of a rectangle. Each of the two long-side portions of relay sheet 110 is provided with a pair of second metal pins 119 in three places. In addition, the pairs of second metal pins 119 provided on one of the long-side portions are aligned in the transverse direction with the pairs of second metal pins 119 on the other long-side portion.

In the case of the present embodiment, liquid crystal module 100 includes pairs of two types of relay sheets 110. One of the types of relay sheets 110 includes connector member 117 attached at a longitudinal end portion of relay sheet 110 for connecting with a harness extending from the power supply board, and third metal pins 118 (see FIG. 6) attached at the other longitudinal end portion of relay sheet 110 for connecting with another relay sheet 110. The other type of relay sheets 110 includes fourth metal pin 116 attached at a longitudinal end portion of relay sheet 110 for connecting with third metal pin 118.

In between the pairs of second metal pins 119 disposed aligned along the transverse direction, relay sheet 110 includes first slit 111 that extends in the longitudinal direction. In addition, relay sheet 110 includes, at both longitudinal end portions of first slit 111, second slit 112 which extends in the direction orthogonal to first slit 111. Furthermore, relay sheet 110 includes, between first slits 111, third slit 113 into which support pin 181 is inserted. Relay sheet 110 includes a slit which is formed in the shape of an H by first slit 111 and two second slits 112 and penetrates relay sheet 110 in the thickness direction, so that the flexibility of relay sheet 110 is also increased through its mechanical structure. By disposing first slit 111 near second metal pins 119 and disposing second slits 112 in positions that sandwich second metal pins 119, relay sheet 110 can respond flexibly, even if LED sheet 109 attached to rear frame 140 is out of position. More specifically, even if the space between two adjacent LED sheets 109 increases due to positional variation, the positional variation can be absorbed by the flexibility of relay sheet 110. When the space between two adjacent LED sheets 109 decreases due to positional variation, excess bending of relay sheet 110 occurs, but this bending can be absorbed by recessed portion 149 of rear frame 140. In addition, due to the flexibility of relay sheet 110, first metal pin 210 and second metal pin 119 can be readily connected, so the efficiency of connecting work can be improved.

In addition, by using third slit 113 when attaching support pin 181 to rear frame 140, relay sheet 110 does not become an obstacle, so the working efficiency for attaching support pin 181 is improved.

Figure 9:
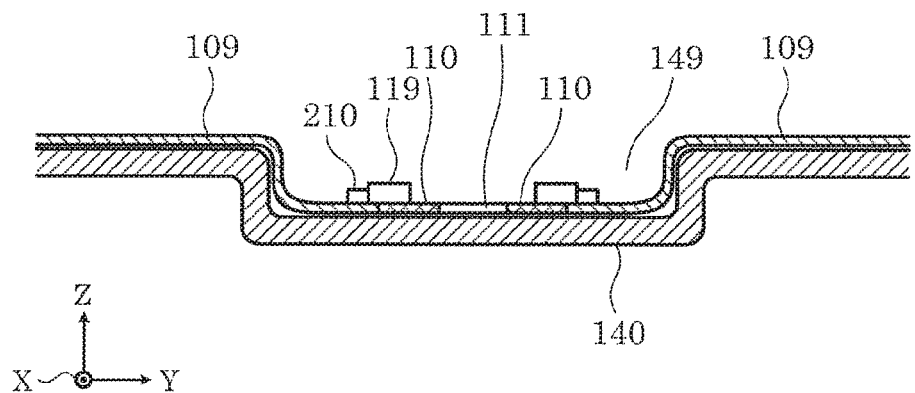
FIG. 9 is a cross-sectional view of connecting portions of the LED sheets and the relay sheets illustrated together with the rear frame, according to the embodiment.
Figure 10:
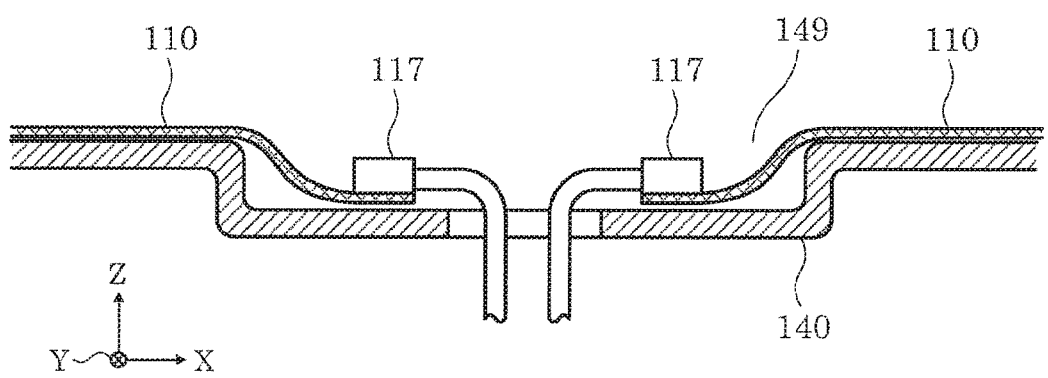
FIG. 10 is a cross-sectional view of adjacent portions of two relay sheets illustrated together with the roar frame, according to the embodiment.

FIG. 9 is a cross-sectional view of connecting portions of the LED sheets and the relay sheets illustrated together with the rear frame. FIG. 10 is a cross-sectional view of adjacent portions of two relay sheets illustrated together with the rear frame.

At a location corresponding to the connecting portion of LED sheet 109 and relay sheet 110, recessed portion 149 which is recessed in a direction away from display panel 102 (negative direction of Z-axis in the drawings) is provided in rear frame 140. In the case of the present embodiment, recessed portion 149 is also provided at a portion where two relay sheets 110 are disposed end-to-end with a predetermined interval therebetween. Note that recessed portion 149 is provided at a connecting portion between relay sheets 110, that is, a connecting portion between metal pin 118 and fourth metal pin 116.

As described above, by providing recessed portion 149 at a location where a metal pin or a connector which protrudes from the surface of relay sheet 110 is present, relay sheet 110 and LED sheet 109 bend into recessed portion 149 such that the metal pin or the connector is housed inside recessed portion 149. Consequently, reflection sheet 108, which is stuck to relay sheet 110 and LED sheet 109, is prevented from being pushed up and is allowed to stick flatly to rear frame 140. Therefore, it is possible to prevent reflection light irregularity and to improve the quality of image display apparatus 10.

Note that the present invention is not limited to the embodiments mentioned above. For example, different embodiments realized by combining arbitrary elements recited in the present specification or by excluding some of the elements recited in the present specification may be embodiments of the present invention. In addition, the present invention includes variations obtained by applying various modifications to the aforementioned embodiments which may be conceived by a person skilled in the art, without departing from the intended meaning of the present invention, that is, the meaning indicated by the wording recited in the claims.

Figure 11:
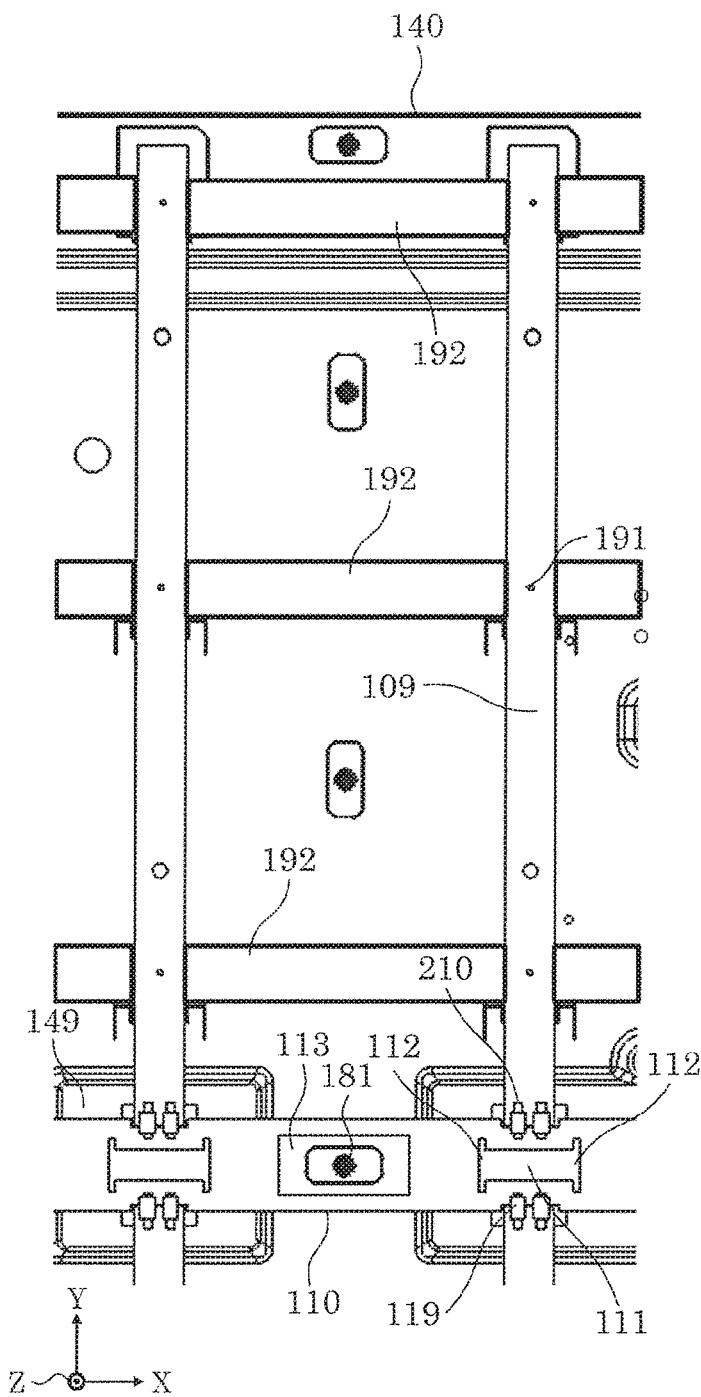
FIG. 11 is a plan view of adhesive layers in a different configuration.

For example, as illustrated in FIG. 11, a double-sided tape which is adhesive layer 192 may be stuck to extend across adjacent LED sheets 109 in a direction perpendicular to the adjacent LED sheets 109. In this manner, LED sheets 109 and reflection sheet 108 can be stuck together at the same time, thereby enabling further reduction in the number of components.

In addition, in the present embodiments, image display apparatus 10 is provided as an apparatus that displays still images and moving images on image display apparatus 10. However, the configuration of image display apparatus 10 may be applied to, for instance, a monitor display for a personal computer and mobile devices such as a tablet terminal or a smartphone.

In addition, adhesive layer 192 may be provided in recessed portions 149 provided in rear frame 140, and LED sheet 109 may be attached along recessed portions 149.

In addition, a reflecting layer that reflects the light emitted by LED 191 may be formed on at least one of LED sheet 109 and relay sheet 110, on the surface on the side in which LED 191 is mounted.

In addition, a through hole may be provided in an irrelevant portion of LED sheet 109 for exposing adhesive layer 192. In this manner, it is possible to stick reflection sheet 108 more firmly to rear frame 140.

INDUSTRIAL APPLICABILITY

The present disclosure is applicable to a television receiver, a monitor display, a digital signage, a tablet terminal, a smartphone, or a table-shaped display apparatus, for example.

The invention claimed is:

1. An image display apparatus, comprising:
a display panel for displaying an image;
a foundation member which is plate-shaped and located on a back side of the display panel, at a position opposite to the display panel;
a plurality of component mounting boards which are attached to the foundation member on a side closer to the display panel, and on which components are mounted, the components being light sources for illuminating the display panel from the back side of the display panel; and a relay sheet which is flexible, is in a shape of a rectangular belt having long-side portions extending in a longitudinal direction, and provided with wiring for relaying power to be supplied to the plurality of component mounting boards, wherein:

the relay sheet includes:

a plurality of metal pins which are aligned on both of the long-side portions in a transverse direction crossing the longitudinal direction, and are connected with the plurality of component mounting boards; and a first slit which improves flexibility, and extends in the longitudinal direction.

2. The image display apparatus according to claim 1, wherein the relay sheet includes a second slit that crosses and is connected to the first slit.

3. The image display apparatus according to claim 1, wherein the foundation member includes a recessed portion at a location corresponding to a connecting portion of a component mounting board among the plurality of component mounting boards and the relay sheet, the recessed portion being recessed in a direction away from the display panel.

4. The image display apparatus according to claim 1, further comprising:

an adhesive layer which has a length that extends beyond a component mounting board among the plurality of component mounting boards, at least at positions on the component mounting board at which the components are mounted, and sticks a reflection sheet and the plurality of component mounting boards to the foundation member.

* * * * *